United States Patent
Yoo et al.

(10) Patent No.: US 8,952,404 B2
(45) Date of Patent: Feb. 10, 2015

(54) LIGHT-EMITTING DEVICE PACKAGE AND METHOD OF MANUFACTURING THE LIGHT-EMITTING DEVICE PACKAGE

(75) Inventors: Cheol-jun Yoo, Chungcheongnam-do (KR); Young-hee Song, Gyeonggi-do (KR)

(73) Assignee: Samsung Electronics Co., Ltd., Seoul (KR)

(*) Notice: Subject to any disclaimer, the term of this patent is extended or adjusted under 35 U.S.C. 154(b) by 408 days.

(21) Appl. No.: 13/348,369

(22) Filed: Jan. 11, 2012

(65) Prior Publication Data
US 2012/0187437 A1    Jul. 26, 2012

(30) Foreign Application Priority Data

Jan. 20, 2011    (KR) .................. 10-2011-0005985

(51) Int. Cl.
*H01L 33/44*    (2010.01)
*H01L 33/48*    (2010.01)
(Continued)

(52) U.S. Cl.
CPC ........ *H01L 33/486* (2013.01); *B29C 45/14344* (2013.01); *B29C 45/14655* (2013.01); *H01L 33/54* (2013.01); *B29C 45/14836* (2013.01);
(Continued)

(58) Field of Classification Search
CPC ....... H01L 33/54; H01L 33/486; H01L 33/62; H01L 23/13
USPC .................. 257/98, 680, E33.068, E33.056, 257/E21.499; 438/27
See application file for complete search history.

(56) References Cited

U.S. PATENT DOCUMENTS

| | | | | |
|---|---|---|---|---|
| 5,286,679 | A | * | 2/1994 | Farnworth et al. ............ 438/118 |
| 6,104,091 | A | * | 8/2000 | Ito et al. ........................ 257/738 |

(Continued)

FOREIGN PATENT DOCUMENTS

| | | |
|---|---|---|
| DE | 19901918 A1 | 7/1999 |
| EP | 0632511 A3 | 11/1996 |

(Continued)

OTHER PUBLICATIONS

Extended European Search Report issued in European Patent Application No. 12151738.7 dated Oct. 5, 2012.

(Continued)

*Primary Examiner* — Ermias Woldegeorgis
(74) *Attorney, Agent, or Firm* — McDermott Will & Emery LLP

(57) ABSTRACT

A light-emitting device package having improved connection reliability of a bonding wire, heat dissipation properties, and light quality due to post-molding and a method of manufacturing the light-emitting device package. The light-emitting device package includes, for example, a wiring substrate having an opening; a light-emitting device that is disposed on the wiring substrate and covers the opening; a bonding wire electrically connecting a bottom surface of the wiring substrate to a bottom surface of the light-emitting device via the opening; a molding member that surrounds a side surface of the light-emitting device and not a top surface of the light-emitting device, which is an emission surface, is formed on a portion of a top surface of the wiring substrate, and is formed in the opening of the wiring substrate to cover the bonding wire; and a solder resist and a bump formed on the bottom surface of the wiring substrate.

22 Claims, 10 Drawing Sheets

(51) Int. Cl.
*B29C 45/14* (2006.01)
*H01L 33/54* (2010.01)
*H01L 33/64* (2010.01)

(52) U.S. Cl.
CPC ....... *H01L 33/647* (2013.01); *H01L 2933/0033* (2013.01); *H01L 2224/32225* (2013.01); *H01L 2224/32245* (2013.01); *H01L 2224/4824* (2013.01); *H01L 2224/4826* (2013.01); *H01L 2224/73215* (2013.01); *H01L 2224/48091* (2013.01); *H01L 2924/15311* (2013.01)
USPC 257/98; 257/680; 257/E33.068; 257/E33.056; 257/E21.499; 438/27

(56) References Cited

U.S. PATENT DOCUMENTS

| | | | |
|---|---|---|---|
| 6,734,465 B1* | 5/2004 | Taskar et al. | 257/80 |
| 7,381,996 B2 | 6/2008 | Hsin Chen | |
| 7,662,672 B2 | 2/2010 | Lin | |
| 2004/0041222 A1* | 3/2004 | Loh | 257/433 |
| 2004/0173810 A1* | 9/2004 | Lin et al. | 257/100 |
| 2007/0064131 A1* | 3/2007 | Sawanobori et al. | 348/294 |
| 2007/0166853 A1 | 7/2007 | Guenther et al. | |
| 2008/0237614 A1 | 10/2008 | Ishikura et al. | |
| 2010/0127290 A1 | 5/2010 | Joo et al. | |
| 2010/0227424 A1* | 9/2010 | Joo et al. | 438/26 |
| 2011/0215365 A1* | 9/2011 | Lin | 257/99 |
| 2012/0138989 A1 | 6/2012 | Yoo et al. | |

FOREIGN PATENT DOCUMENTS

| | | |
|---|---|---|
| JP | 5-138691 A | 6/1993 |
| KR | 2005-0116373 A | 12/2005 |
| KR | 10-2007-0055814 A | 5/2007 |
| KR | 10-2009-0102219 A | 9/2009 |
| KR | 10-2010-0026453 A | 3/2010 |
| KR | 10-2010-0058779 A | 6/2010 |

OTHER PUBLICATIONS

European Office Communication issued in European Application No. 12151738.7 dated Jun. 17, 2014.

* cited by examiner

LIGHT-EMITTING DEVICE PACKAGE AND METHOD OF MANUFACTURING THE LIGHT-EMITTING DEVICE PACKAGE

CROSS-REFERENCE TO RELATED APPLICATIONS

This application claims the benefit of Korean Patent Application No. 10-2011-0005985, filed on Jan. 20, 2011, in the Korean Intellectual Property Office, the disclosure of which is incorporated herein in its entirety by reference.

BACKGROUND

1. Field

The present disclosure relates to light-emitting device packages and methods of manufacturing the same, and more particularly, to light-emitting device packages having improved connection reliability of a bonding wire, heat dissipation properties, and light quality due to post-molding and methods of manufacturing the light-emitting device packages.

2. Description of the Related Art

Light-emitting diodes (LEDs) are semiconductor light-emitting devices that change an electric signal into light by using characteristics of a compound semiconductor. Semiconductor light-emitting devices such as LEDs have a long lifetime, are driven at low voltage, and have low power consumption, compared to other general luminous bodies. Also, semiconductor light-emitting devices such as LEDs have high response speeds and impact resistance and are small and light in weight. Semiconductor light-emitting devices may emit a light of different wavelengths according to the type and composition of a semiconductor used therein. Recently, illumination devices using a light-emitting device chip having high brightness are replacing a conventional phosphor or incandescent lamps.

In order to provide an illumination device using a semiconductor light-emitting device, a packaging process is required in which a light-emitting device chip is connected to a lead frame and encapsulated. For example, in a general packaging process for a light-emitting device, a lead frame mounted on a cup-shaped molding member formed by pre-molding is prepared. Then, a light-emitting device chip is attached to the lead frame on the molding member and wire bonding is performed thereon, and the molding member is filled with a phosphor so that the phosphor surrounds the light-emitting device chip, and finally, the molding member is encapsulated with a light-emitting member having a lens shape.

However, it is difficult for a light-emitting device package manufactured as described above to secure connection reliability of a bonding wire under a high temperature and high humidity conditions, since the bonding wire is encapsulated in a binder resin in which a phosphor is dispersed. For example, different thermal expansion coefficients between the phosphor and the binder resin may cause deformation of the bonding wire. Also, since the molding member is formed on the lead frame in advance, the molding member may not surround the light-emitting device chip. This is because the light-emitting device chip and the molding member need to be spaced apart from each other by an interval so as to mount the light-emitting device chip on the lead frame and connect the light-emitting device chip to the lead frame via a bonding wire. Accordingly, it is difficult to use light emitted from a side surface of the light-emitting device chip and thus brightness of the light-emitting device package is degraded. Also, the light emitted from side surfaces of the light-emitting device chip may lead to non-uniform color quality.

SUMMARY

Provided are light-emitting device packages capable of securing connection reliability of a bonding wire and improving heat dissipation properties and light quality and methods of manufacturing the light-emitting device packages.

Additional aspects will be set forth in part in the description which follows and, in part, will be apparent from the description, or may be learned by practice of the presented embodiments.

According to an aspect of the present invention, a light-emitting device package includes: a wiring substrate having an opening; a light-emitting device that is disposed on the wiring substrate and covers the opening; a bonding wire electrically connecting a bottom surface of the wiring substrate to a bottom surface of the light-emitting device via the opening; and a molding member that surrounds a side surface of the light-emitting device and not a top surface of the light-emitting device, which is an emission surface, is formed on a portion of a top surface of the wiring substrate, and is formed near the opening of the wiring substrate to cover the bonding wire.

For example, the wiring substrate may include a pair of lead frames that are electrically separated from each other with the opening therebetween, and the opening is a space interposed between the separate lead frames.

According to an embodiment of the present invention, the molding member formed around the opening may be evenly formed with the bottom surface of the wiring substrate.

According to an embodiment of the present invention, the wiring substrate has a step at each side of the opening in such a way that a width of a portion of the opening that is located near the light-emitting device is relatively narrow and a width of a portion of the opening that is located near the bottom surface of the wiring substrate is relatively wide.

According to another embodiment of the present invention, the wiring substrate may include an insulating resin substrate having the opening and a pair of metal wiring patterns that are electrically separated from each other with the opening therebetween and that are disposed on a bottom surface of the insulating resin substrate.

Also, the light-emitting device package may further include a solder resist that is disposed on the bottom surface of the wiring substrate and has a predetermined pattern and a solder bump that is formed on a portion of the bottom surface of the wiring substrate on which the solder resist is not formed.

For example, a width of the opening is narrower than a width of the light-emitting device, and a length of the opening is greater than the width of the light-emitting device.

Also, the light-emitting device package may further include a phosphor layer formed on the emission surface of the light-emitting device.

According to an embodiment of the present invention, the molding member may surround a side surface of the phosphor layer.

According to another embodiment of the present invention, a top surface of the molding member and the top surface of the light-emitting device lie on an identical plane, and the phosphor layer on the light-emitting device lies higher than the top surface of the molding member.

Also, the light-emitting device package may further include a lens-type transparent encapsulation member disposed above the molding member and the light-emitting device.

According to an embodiment of the present invention, the molding member may further cover a side surface of the wiring substrate.

For example, the molding member may include a white or colored molding material.

According to an embodiment of the present invention, the molding member may include: a first molding member that directly contacts and surrounds the light-emitting device; and a second molding member that surrounds the first molding member, is formed on the wiring substrate, and is formed around the opening so as to surround the bonding wire.

In this case, the first molding member may include a white molding material and the second molding material may include a colored molding material.

According to an embodiment of the present invention, the wiring substrate has a plurality of openings, and the bonding wire electrically connects the light-emitting device to the wiring substrate via each of the openings.

For example, a length of each of the openings is smaller than a width of the light-emitting device, and the openings extend over a boundary of the light-emitting device.

According to another aspect of the present invention, a method of manufacturing a light-emitting device package includes: providing a wiring substrate having an opening; disposing a light-emitting device on the wiring substrate to cover the opening; connecting a bottom surface of the light-emitting device to a bottom surface of the wiring substrate via the opening by using a bonding wire; and forming a molding member in such a way that the molding member surrounds a side surface of the light-emitting device and not a top surface of the light-emitting device, which is an emission surface, is formed on a portion of a top surface of the wiring substrate, and is formed in the opening of the wiring substrate to cover the bonding wire.

For example, in the forming of the molding member, the wiring substrate on which the light-emitting device is attached is disposed on a die and then transfer molding is performed thereon to form the molding member.

According to an embodiment of the present invention, the forming of the molding member may include: arranging the wiring substrate on which the light-emitting device is attached on a bottom die; covering the bottom die with a top die to seal a cavity between the bottom die and the top die and not the inlet and the outlet; injecting a molding material into the cavity via the inlet; and cooling the molding material; and removing the bottom die and the top die.

According to an embodiment of the present invention, the top surface of the light-emitting device contacts a bottom surface of the top die, and a space between the bottom die and the wiring substrate is completely sealed so as to allow the molding material injected via the inlet to flow toward a top side of the wiring substrate.

Also, a width of the opening is narrower than a width of the light-emitting device and a length of the opening is greater than the width of the light-emitting device, and the molding material flows toward a bottom side of the wiring substrate via the opening to fill the opening covering the bonding wire.

Also, according to an embodiment of the present invention, a portion of a top surface of the bottom die that faces the opening of the wiring substrate has a groove for forming the molding member around the opening.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
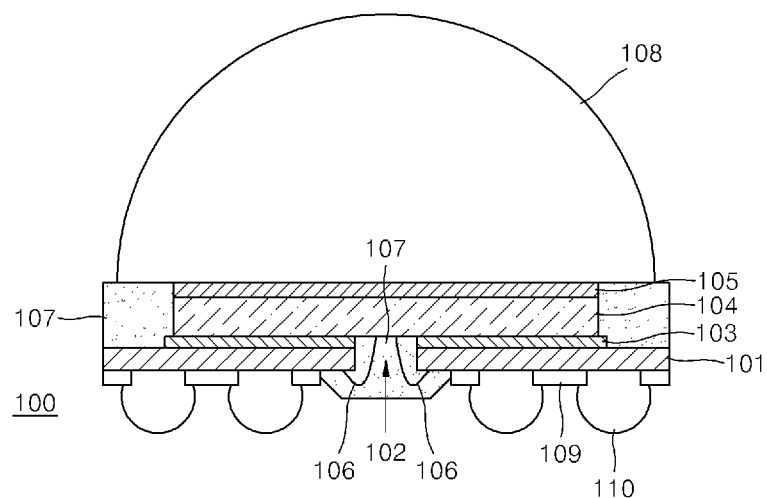
FIG. 1 is a schematic cross-sectional view of a light-emitting device package according to an embodiment of the present invention.

Reference will now be made in detail to embodiments, examples of which are illustrated in the accompanying drawings, wherein like reference numerals refer to like elements throughout and sizes of the respective elements may be exaggerated for clarity and convenience. In this regard, the present embodiments may have different forms and should not be construed as being limited to the descriptions set forth herein. Accordingly, the embodiments are merely described below, by referring to the figures, to explain aspects of the present description.

FIG. 1 is a schematic cross-sectional view of a light-emitting device package 100 according to an embodiment of the present invention. Referring to FIG. 1, the light-emitting device package 100 according to the present embodiment includes a wiring substrate 101 having an opening 102, a light-emitting device 104 disposed on the wiring substrate 101, a pair of bonding wires 106 that electrically connect a bottom surface of the light-emitting device 104 to a bottom surface of the wiring substrate 101 via the opening 102, and a molding member 107 that surrounds a side surface of the light-emitting device 104 and not a top surface of the light-emitting device 104, which is an emission surface, is formed on a portion of a top surface of the wiring substrate 101, and is formed near the opening of the wiring substrate 101 to cover the bonding wires 106.

Also, the light-emitting device package 100 may further include, for example, a transparent encapsulation member 108 that is hemispherical and is disposed on the molding member 107 and the light-emitting device 104. Also, the light-emitting device package 100 may further include a solder resist 109 and a solder bump 110 which are formed on the bottom surface of the wiring substrate 101.

The light-emitting device 104 may be, for example, a semiconductor light-emitting device, such as a light-emitting diode (LED.) Referring to FIG. 1, the light-emitting device 104 may be disposed on the wiring substrate 101, covering the opening 102. The light-emitting device 104 may be fixed on the wiring substrate 101 by using, for example, an adhesive layer 103. Also, a phosphor layer 105 may be further coated on the top surface of the light-emitting device 104. The phosphor layer 105 is excited by light emitted from the light-emitting device 104 and produces white light. To do this, the phosphor layer 105 may be formed by dispersing either a phosphor material in a resin or a plurality of phosphor materials at a predetermined combination ratio in a resin. The kind and combination ratio of phosphor materials dispersed in a resin, such as a silicon resin or an epoxy resin, may vary depending on the luminescent characteristics of the light-emitting device 104. The phosphor layer 105 may be completely coated on the top surface of the light-emitting device 104, which is an emission surface. However, if white light emission is not required, the phosphor layer 105 may not be formed.

Regarding the light-emitting device 104 illustrated in FIG. 1, an electrode pad (not shown) may be formed on the bottom surface of the light-emitting device 104 that is opposite to the emission surface of the light-emitting device 104. Accordingly, an end of a bonding wire 106 may be connected to the electrode pad formed on the bottom surface of the light-emitting device 104. The other end of the bonding wire 106 passes through the opening 102 of the wiring substrate 101 and is connected to the bottom surface of the wiring substrate 101. For electrical connection with a bonding wire 106, a bonding pad may be formed on the bottom surface of the wiring substrate 101. In the embodiment illustrated in FIG. 1, the bonding wires 106 are connected to not the top surface of the light-emitting device 104 but the bottom surface of the light-emitting device 104, and thus, there is no need to form an electrode pad on the top surface of the light-emitting device 104. Accordingly, a size of the top surface of the light-emitting device 104, i.e., the size of the emission surface, may be relatively increased. Also, since there is no need for an additional space for wire bonding in an area surrounding the side surface of the light-emitting device 104, an overall size of the light-emitting device package 100 may be further reduced.

The wiring substrate 101 is connected to an external power source (not shown) and provides a current supplied by the external power source to the light-emitting device 104 via the bonding wires 106. Also, the wiring substrate 101 may dissipate heat generated by the light-emitting device 104 to the outside. To do this, the wiring substrate 101 may include a metal wiring having conductivity. For example, the wiring substrate 101 may be a lead frame formed of metal. In this case, the wiring substrate 101 may include a pair of lead frames with the opening 102 therebetween, wherein the lead frames face each other and are electrically disconnected from each other. In this regard, the opening 102 may be a space between the separate lead frames. In another embodiment, the wiring substrate 101 may be, for example, a printed circuit board (PCB), that is, the wiring substrate 101 may include an insulating resin substrate and a metal wiring pattern formed on a bottom surface of the insulating resin substrate. In this regard, the insulating resin substrate may have the opening 102 passing therethrough at a center thereof, and a pair of metal wiring patterns may face each other with the opening 102 therebetween and may be electrically disconnected from each other. In this case, the bonding wires 106 may be respectively connected to the lead frames or metal wiring patterns.

Figure 2:
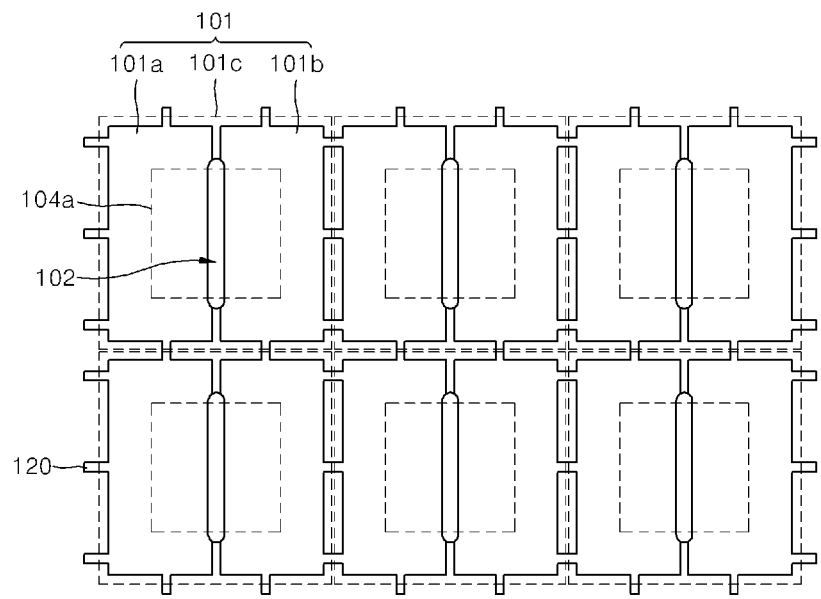
FIG. 2 is a schematic bottom view of the light-emitting device package of FIG. 1 illustrating a wiring substrate and a metal wiring pattern.

FIG. 2 is a schematic bottom view of the light-emitting device package 100 exemplarily illustrating the wiring substrate 101 and a metal wiring pattern formed on the bottom surface of the wiring substrate 101. Referring to FIG. 2, for example, the wiring substrate 101 may include an insulating resin substrate 101c having the opening 102 at its center and metal wiring patterns 101a and 101b formed on a bottom surface of the insulating resin substrate 101c with the opening 102 disposed therebetween. FIG. 2 illustrates an array of a plurality of insulating resin substrates 101c and a plurality of metal wiring patterns 101a and 101b for manufacturing a plurality of light-emitting device packages 100 in a batch process. For example, the metal wiring patterns 101a and 101b may be connected to each other via a plurality of tie bars 120 in a two-dimensional matrix form. Also, although the insulating resin substrate 101c is indicated by a dashed line in FIG. 2, the insulating resin substrates 101c may actually be one large substrate. When manufacture of the light-emitting device packages 100 is completed, the tie bars 120 may be cut to separate the respective light-emitting device packages 100. Accordingly, this structure may be suitable for mass-production of the light-emitting device package 100. If the wiring substrate 101 is a lead frame, the wiring substrate 101 may include only the metal wiring patterns 101a and 101b.

In FIG. 2, an area 104a on which the light-emitting device 104 is to be disposed on the top surface of the wiring substrate 101 is indicated by a square dashed line. As illustrated in FIG. 2, the opening 102 is like a slot having a narrow width and a long length. For example, a width of the opening 102 may be narrower than that of the light-emitting device 104 and a length of the opening 102 may be greater than the width of the light-emitting device 104. Accordingly, even when the light-emitting device 104 is disposed on the wiring substrate 101, the opening 102 is not completely covered by the light-emitting device 104. This structure is to allow a material for forming the molding member 107 to flow toward upside and downside of the wiring substrate 101 via the opening 102 when the molding member 107 is formed.

As illustrated in FIG. 1, the solder resist 109 and the solder bump 110 may be formed on the bottom surface of the wiring substrate 101. The solder bump 110 may enable the light-emitting device package 100 to be surface-mounted on a circuit substrate of other devices, such as an illumination device using the light-emitting device package 100. In order to form the solder bump 110, for example, the solder resist 109 may be formed in a predetermined pattern on the bottom surface of the wiring substrate 101 in advance. Then, the solder bump 110 may be attached to a portion of the bottom surface of the wiring substrate 101 on which the solder resist 109 is not formed.

FIGS. 3A to 3E are bottom views of the light-emitting device package 100 illustrating various bottom structures of the wiring substrate 101 for forming the solder bump 110. For example, referring to FIG. 3A, the solder resist 109 may be formed on the bottom surface of the wiring substrate 101 other than on bonding pads 116 and ball lands 110a. The bonding pads 116 and the ball lands 110a where the solder resist 109 is not formed may expose, for example, the metal wiring patterns 101a and 101b of the wiring substrate 101. The bonding pads 116 which face each other with the opening 102 therebetween are areas for connecting the bonding wires 106 to the metal wiring patterns 101a and 101b, respectively. The ball lands 110a are areas on which the solder bumps 110 are to be formed. As described above, since the solder resist 109 is not formed on the bonding pads 116 and the ball lands 110a and the metal wiring patterns 101a and 101b are exposed by the bonding pads 116 and the ball lands 110a, the bonding wires 106 and the solder bump 101 are attachable to the metal wiring patterns 101a and 101b. Also, the use of the solder resist 109 enables the solder bump 101 to be formed on only a desired region on the metal wiring patterns 101a and 101b.

Figure 3A:
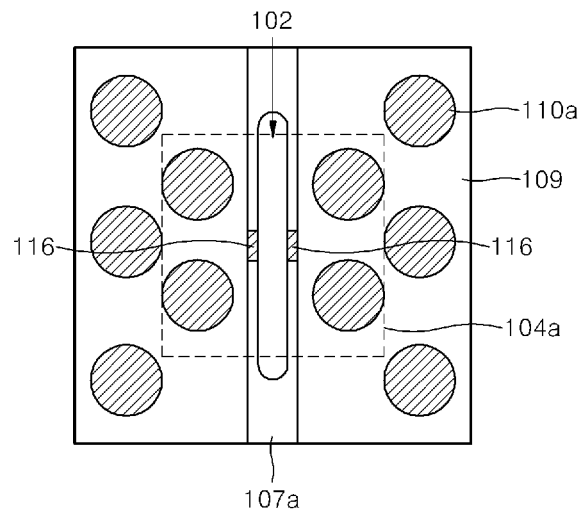
FIGS. 3A to 3E are bottom views of the light-emitting device package of FIG. 1 illustrating various bottom structures of a wiring substrate.
Figure 3B:
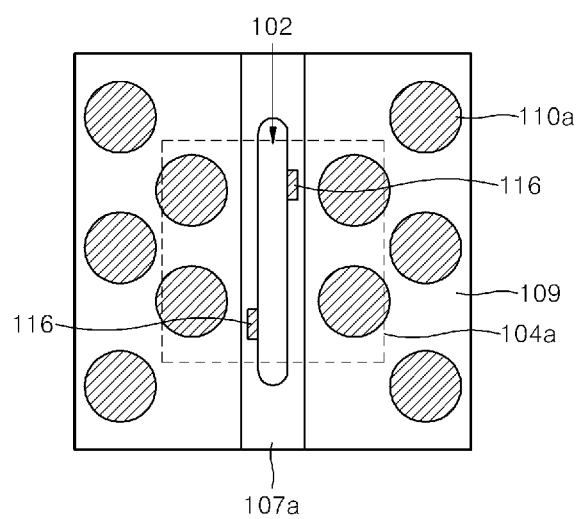
Figure 3C:
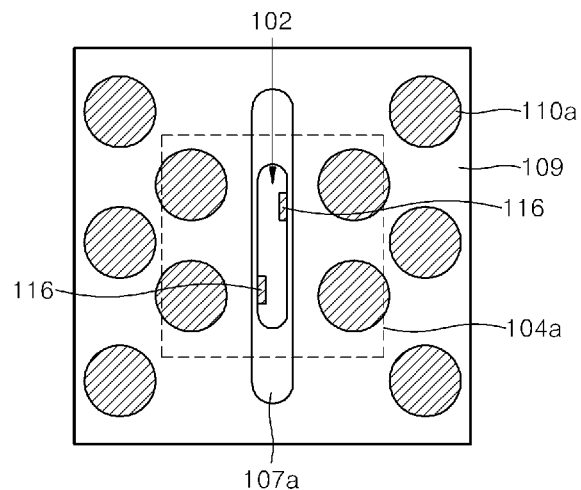
Figure 3D:
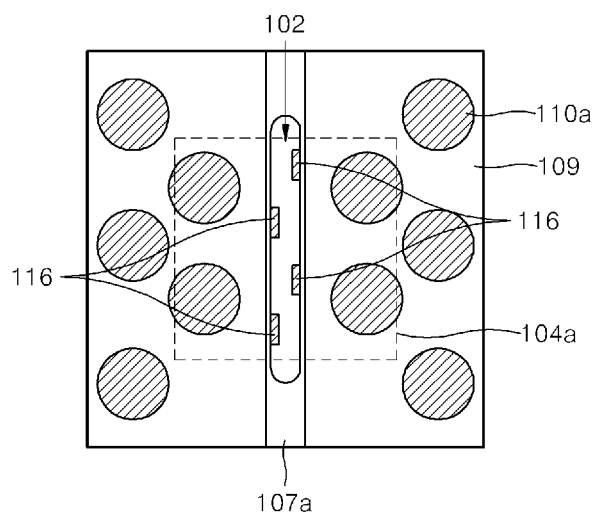
Figure 3E:
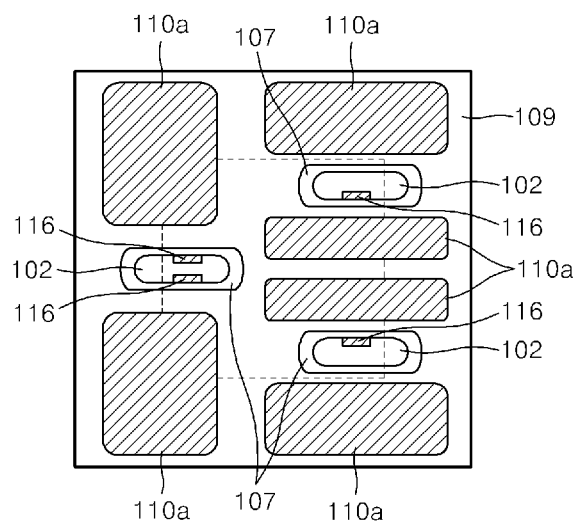

The bonding pads 116 illustrated in FIG. 3A face each other with the opening 102 therebetween. However, the present invention is not limited thereto. For example, as illustrated in FIG. 3B, the bonding pads 116 may diagonally face each other on facing inner sides of the opening 102. Also, the bonding pads 116 may protrude into the opening 102, as illustrated in FIG. 3C. To do this, the metal wiring patterns 101a and 101b may be patterned in such a way that a portion of each of the metal wiring patterns 101a and 101b protrudes or extends into the opening 102. Also, the solder resist 109 may not be formed on the protrusions of the metal wiring patterns 101a and 101b that extend into the opening 102. The number of bonding pads 116 protruding into the opening 102 may be two or more, as illustrated in FIG. 3D. Also, as illustrated in FIG. 3E, the wiring substrate 101 may have a plurality of openings 102, and the bonding pads 116 may be formed at each of the openings 102. If there are a plurality of openings 102, a length of each of the openings 102 may be shorter than a width of the area 104a on which the light-emitting device 104 is to be disposed. In this case, the openings 102 extend over a boundary of the area 104a on which the light-emitting device 104 is to be formed, and thus, even when the light-emitting device 104 is attached to the wiring substrate 101, the openings 102 may be incompletely covered. Referring to FIGS. 3A to 3E, an area 107a on which the molding member 107 is to be formed is around the opening 102. The molding member 107 may be formed in the area 107a around the opening 102 after wire bonding is completed, so as to completely cover the opening 102 and the bonding wires 106.

FIGS. 4A to 4F are schematic cross-sectional views illustrating a method of manufacturing the light-emitting device package 100 of FIG. 1, according to an embodiment of the present invention. First, referring to FIG. 4A, the wiring substrate 101 having the opening 102 at its center is prepared, and the solder resist 109 having a predetermined pattern is formed on the bottom surface of the wiring substrate 101. Then, referring to FIG. 4B, the light-emitting device 104 is attached to the top surface of the wiring substrate 101 by using the adhesive layer 103. In this case, the phosphor layer 105 may be coated on the upper surface of the light-emitting device 104 in advance. However, alternatively, the coating of the phosphor layer 105 on the top surface of the light-emitting device 104 may be performed after the light-emitting device 104 is attached to the top surface of the wiring substrate 101. If the light-emitting device 104 emits white light, the phosphor layer 105 may not be formed. Also, even when the light-emitting device package 100 is to emit a particular color light, the phosphor layer 105 may not be formed on the light-emitting device 104.

Figure 4A:
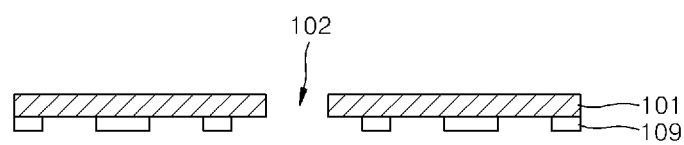
FIGS. 4A to 4F are schematic cross-sectional views illustrating a method of manufacturing a light-emitting device package of FIG. 1, according to an embodiment of the present invention.
Figure 4B:
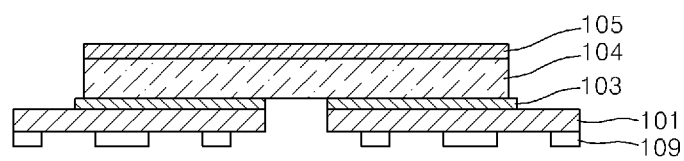
Figure 4C:
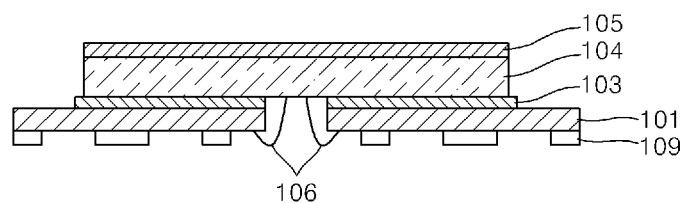

Then, referring to FIG. 4C, the bonding wires 106 connect the bottom surface of the light-emitting device 104 to the bottom surface of the wiring substrate 101. To do this, electrode pads (not shown) may be formed on the bottom surface of the light-emitting device 104, and the bonding pads 116 (see FIG. 3) on the bottom surface of the wiring substrate 101 to be on facing inner sides of the opening 102. Thus, the bonding wires 106 may electrically connect the electrode pads of the light-emitting device 104 respectively to the bonding pads 116 of the wiring substrate 101 via the opening 102.

Figure 4D:
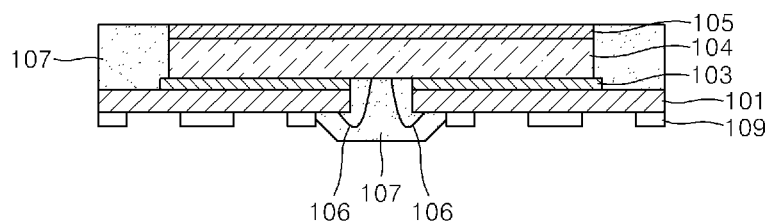

Then, referring to FIG. 4D, the molding member 107 is formed surrounding the side surface of the light-emitting device 104 on the wiring substrate 101. In this case, the molding member 107 may also be formed around the opening 102 to cover the opening 102 and the bonding wires 106. For example, the wiring substrate 101 on which the light-emitting device 104 is attached is disposed in a die and a transfer molding method is performed thereon to form the molding member 107.

Figure 5:
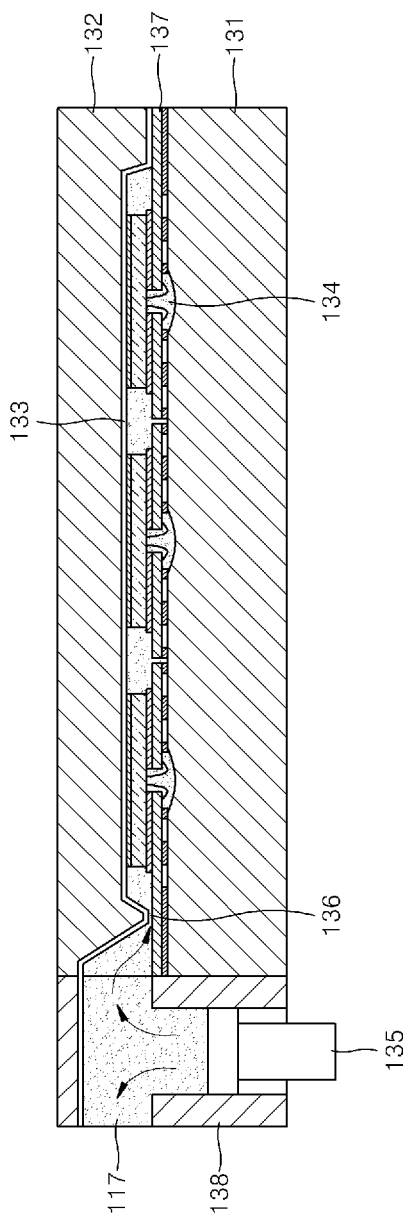
FIG. 5 shows a schematic cross-sectional view illustrating a process for forming a molding member in the method of manufacturing the light-emitting device package of FIG. 1.

FIG. 5 illustrates an example of a transfer molding method for forming the molding member 107. Referring to FIG. 5, a light-emitting device package manufactured in the process illustrated in FIG. 4C is placed on a bottom die 131, and then the bottom die 131 is covered with a top die 132 to completely seal a cavity for molding between the bottom die 131 and the top die 132. In this case, only an inlet 136, which is located left to the bottom and top dies 131 and 132, and an outlet 137, which is located right to the bottom and top dies 131 and 132, are open. In this case, the top surface of the light-emitting device 104 completely contacts a bottom surface of the top die 132. A molding film 133 is formed on the bottom surface of the top die 132 so as to protect the top surface of the light-emitting device 104 and to prevent a molding material 117 from attaching to the bottom surface of the top die 132. Also, since the bottom die 131 completely contacts the wiring substrate 101, the molding material 117 that is injected to the cavity via the inlet 136 is guided to flow toward the top side of the wiring substrate 101. Also, a top surface of the bottom die 131 facing the opening 102 of the wiring substrate 101 has a groove 134 for forming the molding member 107 around the opening 102.

Then, a pot block 138 for providing the molding material 117 is fixed at the inlet 136, and the molding material 117 is injected into the cavity via the inlet 136 by pressing the molding material 117 using a plunger 135. By doing so, the molding material 117 flows toward the top side of the wiring substrate 101 and completely covers the side surface of the light-emitting device 104. Also, the molding material 117 flows toward the bottom side of the wiring substrate 101 via the opening 102 and completely fills the opening 102 and completely surrounds the bonding wire 106. When the liquid molding material 117 completely fills the cavity, the molding material 117 is hardened by cooling. After the cooling is completely performed, the bottom and top dies 131 and 132 are removed, thereby obtaining the molding member 107 illustrated in FIG. 4D.

Figure 4E:
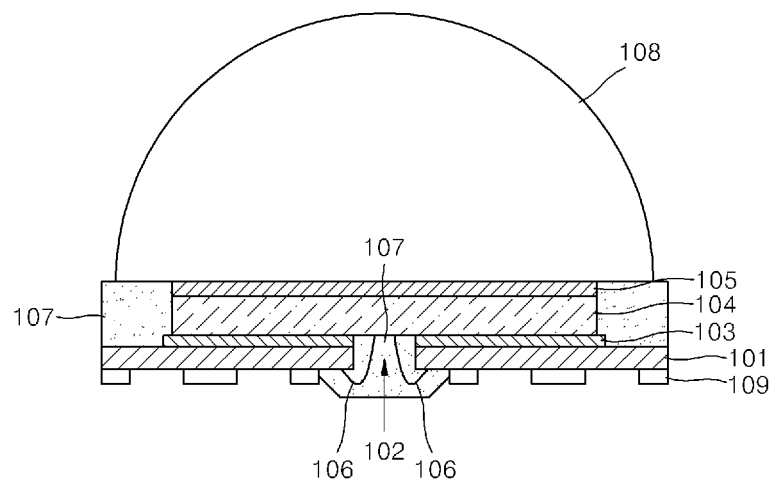
Figure 4F:
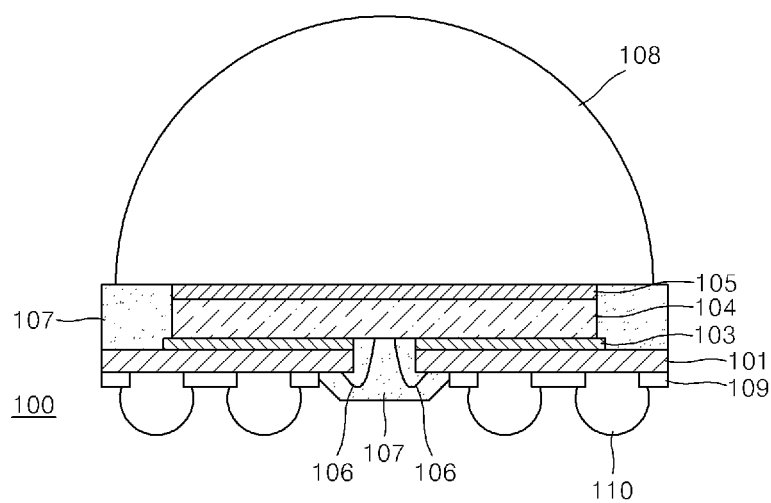

Then, as illustrated in FIG. 4E, the transparent encapsulation member 108 is disposed on the molding member 107. The transparent encapsulation member 108 may be, for example, hemispherical. The transparent encapsulation member 108 may be formed of transparent silicon resin. Finally, as illustrated in FIG. 4F, the solder bump 110 is formed on a portion of the bottom surface of the wiring substrate 101 on which the solder resist 109 is not formed. Thus, the light-emitting device package 100 is completely manufactured.

As described above, the light-emitting device package 100 according to the present embodiment of the present invention is manufactured by post-molding. That is, the light-emitting device 104 is mounted on the wiring substrate 101 and then the molding member 107 is formed. Accordingly, compared to a pre-molding method in which the molding member 107 is formed on the wiring substrate 101 before the light-emitting device 104 is mounted, a space for disposing the light-emitting device 104 may be decreased. By post-molding, the size of the light-emitting device package 100 may be further reduced. Also, when the post-molding method is used, the molding member 107 may completely contact and surround the side surface of the light-emitting device 104 and not the upper surface of the light-emitting device 104. Accordingly, if a molding material having high light reflectivity is used, light emitted from the side surface of the light-emitting device 104 is reflected by the molding member 107 and re-used. To do this, according to an embodiment of the present invention, the molding member 107 may include a white molding material having high light reflectivity. For example, the molding member 107 may be formed by mixing $TiO_2$ with a molding resin. By doing so, light reflection efficiency of the light-emitting device package 100 may be improved. Also, even if light is emitted from the side surface of the light-emitting device 104, the phosphor layer 105 needs to be coated only on the top surface of the light-emitting device 104. Thus, the light-emitting device package 100 may have more uniform light quality.

Figure 6:
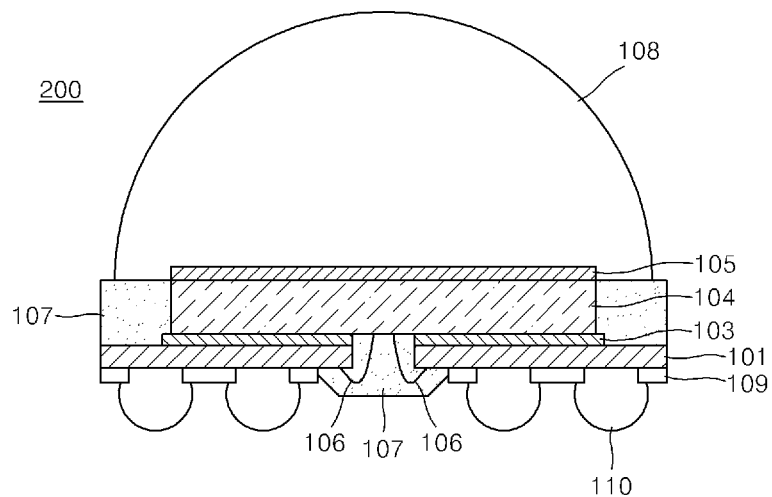
FIGS. 6 to 11 show schematic cross-sectional views of light-emitting device packages according to other embodiments of the present invention.

FIG. 6 is a schematic cross-sectional view of a light-emitting device package 200 according to another embodiment of the present invention. The light-emitting device package 200 of FIG. 6 is different from the light-emitting device package 100 of FIG. 1 in that the top surface of the molding member 107 and the top surface of the light-emitting device 104 lie on the same plane. In the light-emitting device package 100 of FIG. 1, the molding member 107 surrounds the side surface of the light-emitting device 104 and a side surface of the phosphor layer 105. That is, the top surface of the molding member 107 lies higher than that of the light-emitting device 104. On the other hand, in the light-emitting device package 200 of FIG. 6, the molding member 107 surrounds only the side surface of the light-emitting device 104 and not the side surface of the phosphor layer 105. Accordingly, the phosphor layer 105 coated on the light-emitting device 104 lies higher than the top surface of the molding member 107. In the present embodiment, the molding member 107 is formed and then the phosphor layer 105 is formed on the light-emitting device 104. By doing so, damage or contamination by the phosphor layer 105, which may occur during the process for forming the molding member 107, may be prevented. The other elements of the light-emitting device package 200 of FIG. 6 are identical to those of the light-emitting device package 100 of FIG. 1, and thus, a description thereof is omitted.

Figure 7:
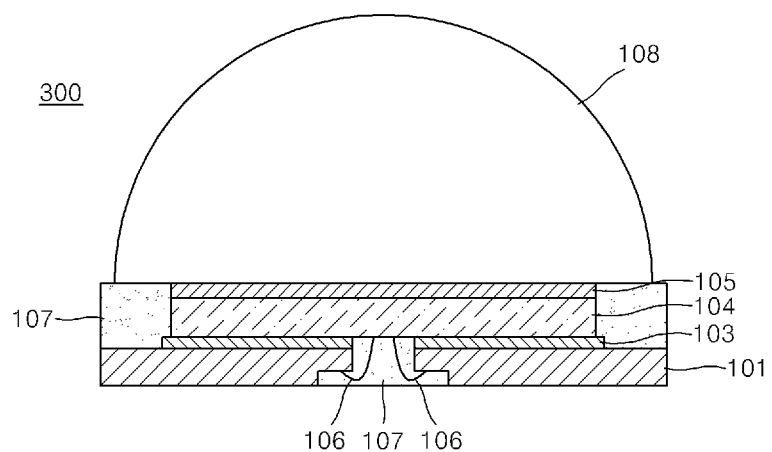

FIG. 7 is a schematic cross-sectional view of a light-emitting device package 300 according to another embodiment of the present invention. In the light-emitting device package 300 of FIG. 7, the solder resist 109 and the solder bump 110 are not formed on the bottom surface of the wiring substrate 101. Instead, the wiring substrate 101 may be a lead frame itself. In this case, a heat dissipation effect of the light-emitting device package 300 may be increased due to direct contact between the lead frame and the light-emitting device 104. In addition, although in the light-emitting device package 100 of FIG. 1, the molding member 107 surrounding the opening 102 protrudes from the wiring substrate 101, in the light-emitting device package 700 of FIG. 7, the molding member 107 formed around the opening 102 of the wiring substrate 101 is evenly formed with the bottom surface of the wiring substrate 101. In this case, the wiring substrate 101 surrounding the opening 102 may have a step at each side of the opening 102 so as to completely cover the bonding wire 106. Accordingly, a width of a portion of the opening 102 that is located near the light-emitting device 104 is relatively narrow and a width of a portion of the opening 102 that is located near the bottom surface of the wiring substrate 101 is relatively wide.

Figure 8:
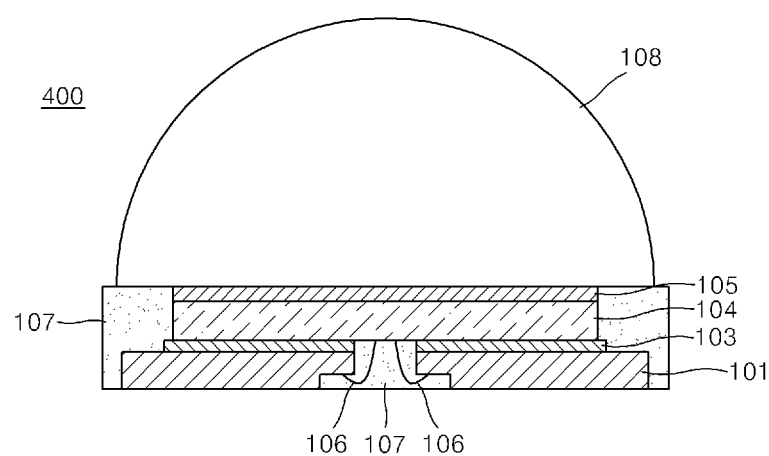

FIG. 8 is a schematic cross-sectional view of a light-emitting device package 400 according to another embodiment of the present invention. Unlike in the light-emitting device package 300 of FIG. 7, in the light-emitting device package 400 of FIG. 8, the molding member 107 further covers a side surface of the wiring substrate 101. In this case, when a plurality of the light-emitting device packages 400 are manufactured in an array form and then divided into individual packages, a lifetime of a cutting device, such as blade, may be increased because cutting portions between the light-emitting device packages 400 are formed of the molding member 107, which has a relatively low rigidity, instead of metal.

Figure 9:
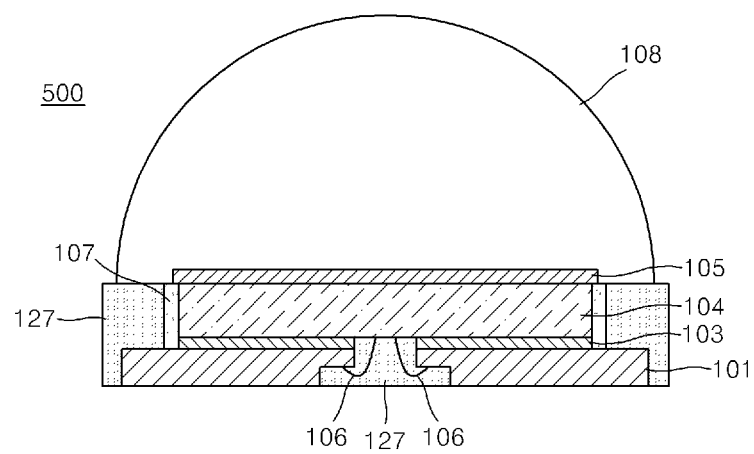

FIG. 9 is a schematic cross-sectional view of a light-emitting device package 500 according to another embodiment of the present invention. The light-emitting device package 500 of FIG. 9 may include a first molding member 107 that directly contacts and surrounds the light-emitting device 104 and a second molding member 127 surrounding the first molding member 107 and the wiring substrate 101. The second molding member 127 may also be formed surrounding the opening 102 so that the molding member 107 completely covers the bonding wire 106 in the opening 102. The first molding member 107 may include a white molding material, and the second molding member 127 may include a non-white, that is, colored molding material. The colored molding material is inexpensive and has excellent mechanical properties and workability compared to the white molding material. Accordingly, when the colored molding material is used, manufacturing costs for the light-emitting device package 500 may be reduced. An example of the colored molding material is an epoxy molding compound (EMC), which is generally used as a material for encapsulating a semiconductor chip. To reflect light emitted from the side surface of the light-emitting device 104, the first molding member 107 including a white molding material is formed on the side surface of the light-emitting device 104 and then, the second molding member 127 is formed thereon. However, if light is not completely emitted from the side surface of the light-emitting device 104, only a molding member including a colored molding material may be used. For example, the molding member 107 illustrated in FIGS. 1 and 6-8 may include a colored molding material, not a white molding material.

Figure 10:
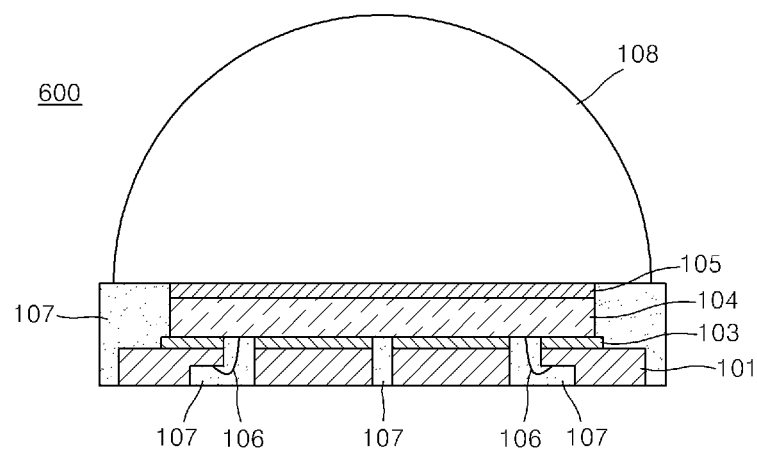

FIG. 10 is a schematic cross-sectional view of a light-emitting device package 600 according to another embodiment of the present invention. In the light-emitting device package 600 of FIG. 10, electrode pads are disposed at opposite lateral sides on the bottom surface of the light-emitting device 104, not the center. Accordingly, the wiring substrate 101 has a plurality of openings 102 corresponding to the electrode pads of the light-emitting device 104. The bonding wires 106 electrically connect the light-emitting device 104 to the wiring substrate 101 via the openings 102.

Figure 11:
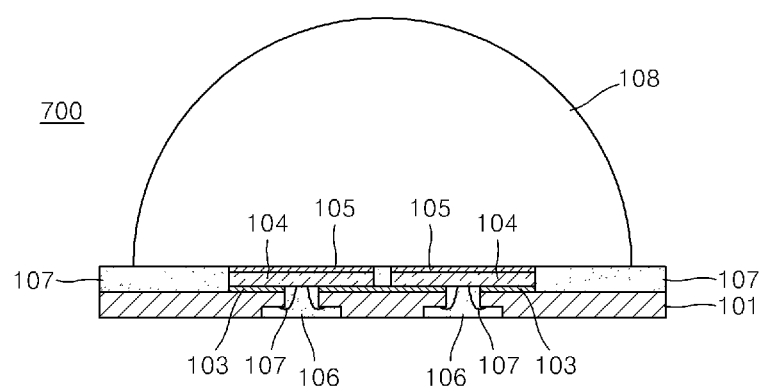

FIG. 11 is a schematic cross-sectional view of a light-emitting device package 700 according to another embodiment of the present invention. The light-emitting device package 700 of FIG. 11 includes a plurality of light-emitting devices 104, each of which is electrically connected to the wiring substrate 101 via a plurality of bonding wires 106 and a plurality of openings 102. In the present embodiment, one light-emitting device package includes a plurality of light-emitting devices 104 and thus brightness of the light-emitting device package 700 may be increased.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:
1. A light-emitting device package, comprising:
a wiring substrate having an opening;
a light-emitting device that is disposed on the wiring substrate and covers the opening;

a bonding wire electrically connecting a bottom surface of the wiring substrate to a bottom surface of the light-emitting device via the opening; and a molding member that surrounds a side surface of the light-emitting device and does not surround a top surface of the light-emitting device, which is an emission surface, is formed on a portion of a top surface of the wiring substrate, and is disposed near the opening of the wiring substrate to cover the bonding wire, wherein the molding member comprises: a first molding member that directly contacts and surrounds the light-emitting device; and a second molding member that surrounds the first molding member, is formed on the wiring substrate, and is formed around the opening so as to surround the bonding wire.

2. The light-emitting device package of claim 1, wherein the wiring substrate comprises a pair of lead frames that are electrically separated from each other with the opening therebetween, and the opening is a space interposed between the separate lead frames.

3. The light-emitting device package of claim 2, wherein the molding member formed around the opening is evenly formed with the bottom surface of the wiring substrate.

4. The light-emitting device package of claim 3, wherein the wiring substrate has a step at each side of the opening in such a way that a width of a portion of the opening that is located near the light-emitting device is relatively narrow and a width of a portion of the opening that is located near the bottom surface of the wiring substrate is relatively wide.

5. The light-emitting device package of claim 1, further comprising a phosphor layer formed on the emission surface of the light-emitting device.

6. The light-emitting device package of claim 5, wherein the molding member surrounds a side surface of the phosphor layer.

7. The light-emitting device package of claim 5, wherein a top surface of the molding member and the top surface of the light-emitting device lie on an identical plane, and the phosphor layer on the light-emitting device lies higher than the top surface of the molding member.

8. The light-emitting device package of claim 1, wherein the wiring substrate has a plurality of openings, and the bonding wire electrically connects the light-emitting device to the wiring substrate via each of the openings.

9. The light-emitting device package of claim 8, wherein a length of each of the openings is smaller than a width of the light-emitting device, and the openings extend over a boundary of the light-emitting device.

10. The light-emitting device package of claim 1, wherein the wiring substrate comprises an insulating resin substrate having the opening and a pair of metal wiring patterns that are electrically separated from each other with the opening therebetween and that are disposed on a bottom surface of the insulating resin substrate.

11. The light-emitting device package of claim 1, further comprising a solder resist that is disposed on the bottom surface of the wiring substrate and has a predetermined pattern and a solder bump that is formed on a portion of the bottom surface of the wiring substrate on which the solder resist is not formed.

12. The light-emitting device package of claim 1, wherein a width of the opening is narrower than a width of the light-emitting device, and a length of the opening is greater than the width of the light-emitting device.

13. The light-emitting device package of claim further comprising a lens-type transparent encapsulation member disposed above the molding member and the light-emitting device.

14. The light-emitting device package of claim 1, wherein the molding member further covers a side surface of the wiring substrate.

15. The light-emitting device package of claim 1, wherein the molding member comprises a white or colored molding material.

16. The light-emitting device package of claim 1, wherein the first molding member comprises a white molding material and the second molding member comprises a colored molding material.

17. A method of manufacturing a light-emitting device package, the method comprising:

providing a wiring substrate having an opening;

disposing a light-emitting device on the wiring substrate to cover the opening;

connecting a bottom surface of the light-emitting device to a bottom surface of the wiring substrate via the opening by using a bonding wire; and forming a molding member in such a way that the molding member surrounds a side surface of the light-emitting device and does not surround a top surface of the light-emitting device, which is an emission surface, is formed on a portion of a top surface of the wiring substrate, and is formed in the opening of the wiring substrate to cover the bonding wire, wherein the molding member comprises: a first molding member that directly contacts and surrounds the light-emitting device; and a second molding member that surrounds the first molding member, is formed on the wiring substrate, and is formed around the opening so as to surround the bonding wire.

18. The method of claim 17, wherein in the forming of the molding member, the wiring substrate on which the light-emitting device is attached is disposed on a die and then transfer molding is performed thereon to form the molding member.

19. The method of claim 18, wherein the forming of the molding member comprises:

arranging the wiring substrate on which the light-emitting device is attached on a bottom die;

covering the bottom die with a top die to seal a cavity between the bottom die and the top die and not the inlet and the outlet;

injecting a molding material into the cavity via the inlet; and cooling the molding material; and removing the bottom die and the top die.

20. The method of claim 19, wherein the top surface of the light-emitting device contacts a bottom surface of the top die, and a space between the bottom die and the wiring substrate is completely sealed so as to allow the molding material injected via the inlet to flow toward a top side of the wiring substrate.

21. The method of claim 20, wherein a width of the opening is narrower than a width of the light-emitting device and a length of the opening is greater than the width of the light-emitting device, and the molding material flows toward a bottom side of the wiring substrate via the opening to fill the opening covering the bonding wire.

22. The method of claim 21, wherein a portion of a top surface of the bottom die that faces the opening of the wiring substrate has a groove for forming the molding member around the opening.

* * * * *